United States Patent
Marbot et al.

[11] Patent Number: 5,973,515
[45] Date of Patent: Oct. 26, 1999

[54] DIFFERENTIAL INPUT STAGE FOR WIDEBAND RECEPTION WITH HIGH REJECTION OF COMMON MODE

[75] Inventors: Roland Marbot, Sassenage; Pascal Couteaux; Anne Pierre Duplessix, both of Grenoble; Reza Nezamzadeh, Meylan; Jean-Claude Le Bihan, Grenoble; Michel D'Hoe, Fontaine; Francis Mottini, Crolles, all of France

[73] Assignee: STMicroelectronics S.A., Gentilly, France

[21] Appl. No.: 09/097,286

[22] Filed: Jun. 12, 1998

[30] Foreign Application Priority Data

Jun. 16, 1997 [FR] France ................. 97 07604

[51] Int. Cl.⁶ ............................................. H03K 5/22
[52] U.S. Cl. ..................... 327/65; 327/563; 327/79; 327/78; 327/82; 327/63
[58] Field of Search ..................... 327/70, 69, 63, 327/72, 100, 563, 73, 79, 50, 82, 78, 65

[56] References Cited

U.S. PATENT DOCUMENTS 5,381,053  1/1995  Yasuda ........................... 327/65
5,574,401  11/1996 Spitalny ......................... 330/253

FOREIGN PATENT DOCUMENTS 0 512 795 A2  11/1992  European Pat. Off. ......... H03K 5/24
0 723 352 A2   7/1996  European Pat. Off. .
   97/17763    5/1997  WIPO ........................... H03K 19/175

OTHER PUBLICATIONS

Coban et al., "Low–Voltage Analog IC Design in CMOS Technology", *IEEE Transactions on Circuits and Systems I: Fundamental Theory and Applications*, vol. 42, No. 11, Nov. 1, 1995, pp. 955–958.

*Primary Examiner*—Dinh T. Le
*Attorney, Agent, or Firm*—Allen, Dyer, Doppelt, Milbrath & Gilchrist, P.A.

[57] ABSTRACT

An integrated circuit comprises at least one differential input stage. The differential input stage includes an input circuit and a shaping circuit. The input circuit comprises a first portion and a second portion for providing two pairs of differential signals. The propagation times of the first and second circuit portions are preferably substantially identical. The shaping circuit differentiates each of the two pairs of differential signals and combines them to obtain a single binary type of signal.

29 Claims, 2 Drawing Sheets

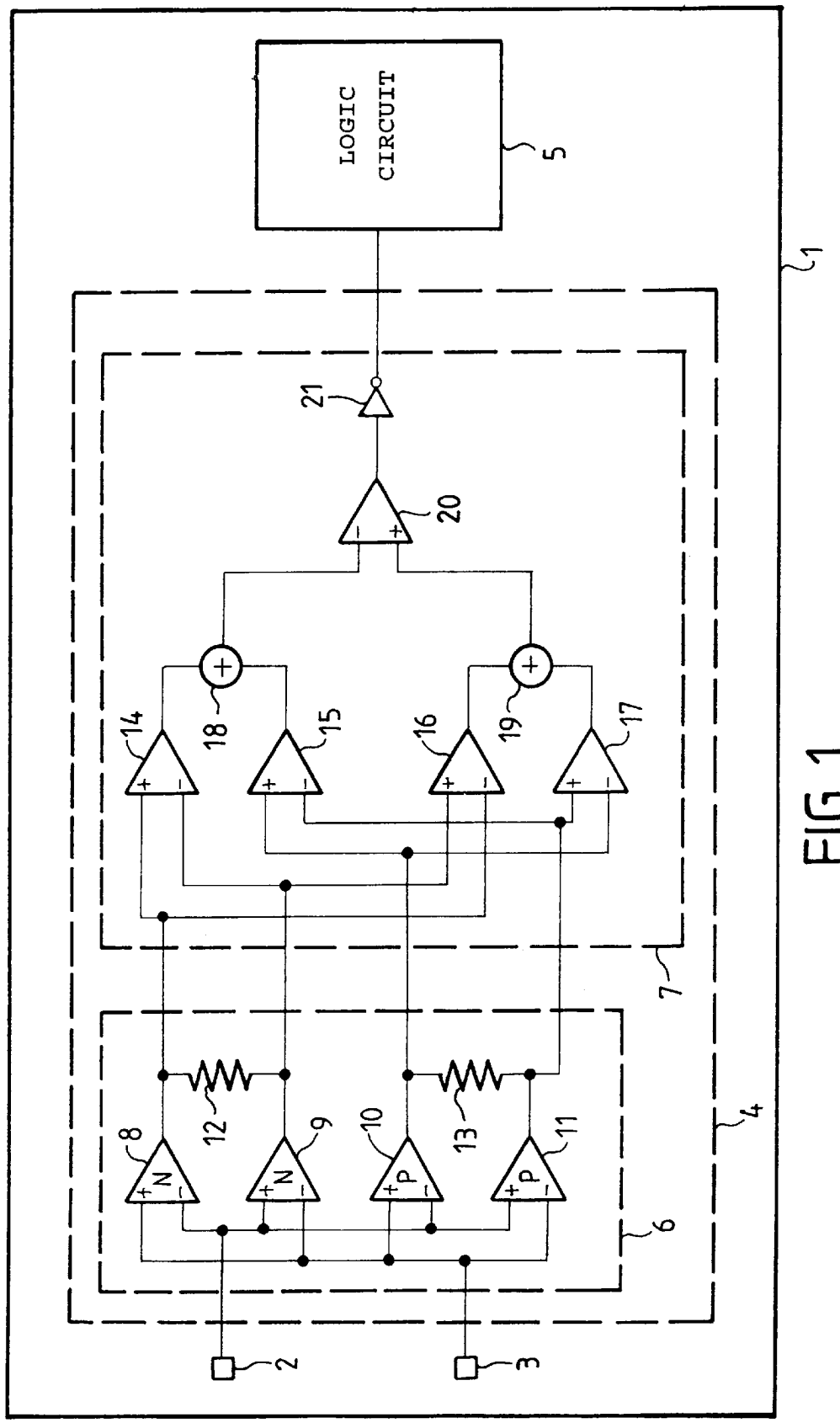
FIG_1

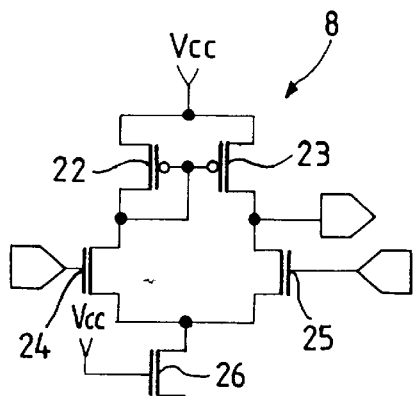
FIG_2
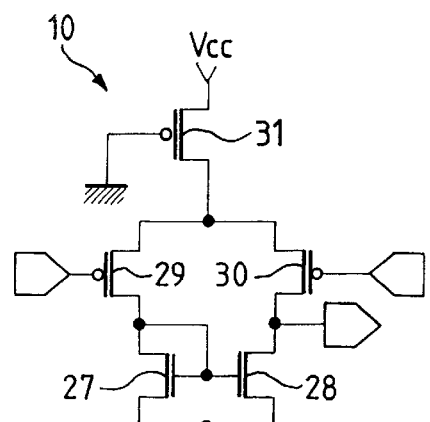
FIG_3
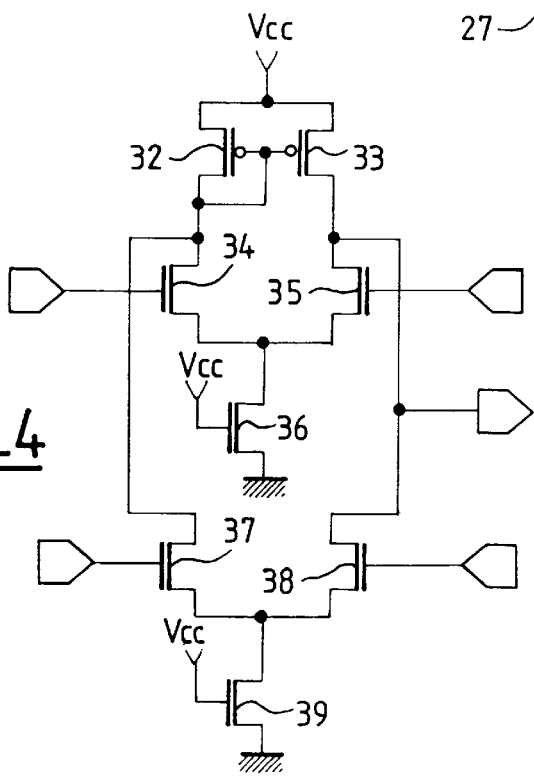
FIG_4
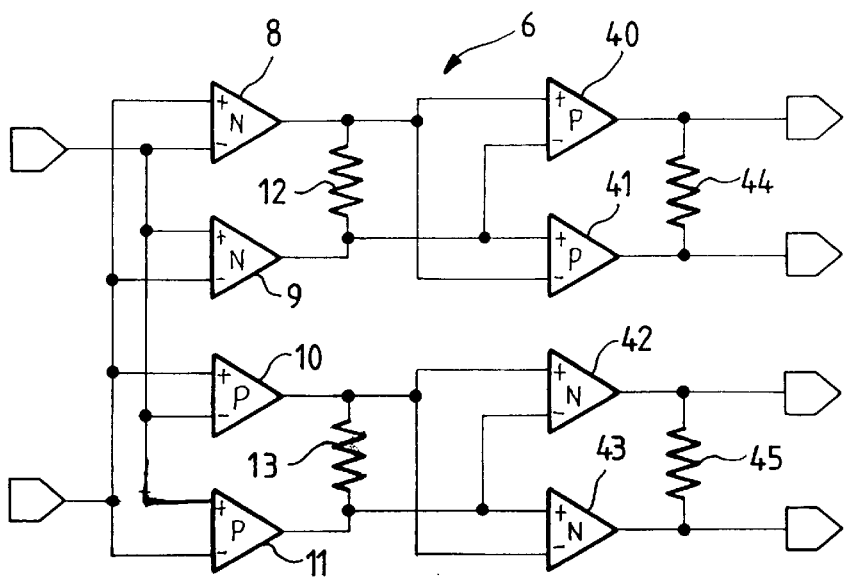
FIG_5

5,973,515

DIFFERENTIAL INPUT STAGE FOR WIDEBAND RECEPTION WITH HIGH REJECTION OF COMMON MODE

FIELD OF THE INVENTION

The invention relates to integrated circuits comprising one or more differential input stages for wideband reception with high common mode rejection. More specifically, the invention relates to low-voltage supply circuits having differential type serial communications ports using high bit rates.

BACKGROUND OF THE INVENTION

Differential type serial ports are generally used to establish links between different devices that are at relatively larger distances from one another. The European reference EP-A-0 723 352 describes an example of this type of link. Reference will be made especially to FIGS. 1, 2A and 2B and to the part of the description pertaining thereto. As explained in the reference, it is possible to perceive the appearance of an additional common mode voltage due to a difference in loads between the devices using this type of link. This common mode voltage may prompt dysfunctioning if it is outside a range of operation of a differential amplifier.

The European reference proposes an approach including offsetting the differential signals and driving two differential stages, one with the signals offset, and the other with the signals not offset. The differential stages are connected to one another by means of a wired OR connection that gives a pair of differential signals to a differential amplifier.

The device disclosed in the European reference performs relatively well when there is a common mode voltage that is of a static type or a type with low variability. However, if there is a common mode voltage that varies greatly, for example, in the vicinity of a high-frequency transmitter, a phenomenon of phase jitter is seen to appear. This is due to the difference in electrical paths between the offset signals and the signals that are not offset. This phenomenon of phase jitter is particularly troublesome when a transmission frequency in the range of one GHz is used.

SUMMARY OF THE INVENTION

In view of the foregoing background, it is therefore an object of the invention to provide an input stage for overcoming the phenomenon of phase jitter. The invention uses two stages in parallel, working with substantially the same propagation times.

One embodiment of the invention is directed to an integrated circuit comprising at least one differential input stage having two differential inputs and one output, the differential input stage including an input circuit and a shaping circuit. The input circuit has two inputs connected to the two inputs of the differential input stage. The input circuit also includes first means to provide a first pair of differential signals when the inputs receive signals in a first range of voltage, and a zero differential voltage when the inputs receive signals outside the first range of voltage; and second means to provide a second pair of differential signals when the inputs receive signals in a second range of voltage, and a zero differential voltage when the inputs receive signals outside the second range of voltage. The propagation times of the first and second means are substantially identical. The shaping circuit comprises means to differentiate each of the two pairs of differential signals and combine them to obtain a single binary type of signal.

Preferably, the first and second means comprise differential amplifiers. One of the means has N-type input transistors and the other of the means has P-type input transistors. In addition, the transistors are sized to have equivalent timing characteristics.

The recombination of the pairs of differential signals can be done by means of a pair of differential amplifiers of the same type sharing a common load to obtain a wired logic OR circuit. Preferably, recombination is duplicated to produce a new differential pair.

BRIEF DESCRIPTION OF THE DRAWINGS

The invention will be understood more clearly and other features and advantages shall appear from the following description, made with reference to the appended drawings, of which:

FIG. 1 shows the preferred embodiment of the invention,

FIGS. 2 and 3 show a preferred embodiment of the differential amplifiers of the first and second means, FIG. 4 shows the pair of differential amplifiers used to recombine the pairs of differential signals, and FIG. 5 shows an alternative embodiment of the input circuit.

DETAILED DESCRIPTION OF THE PREFERRED EMBODIMENTS

FIG. 1 shows an integrated circuit 1 which comprises first and second input pads 2 and 3, a differential input stage 4 and a logic circuit 5. Naturally, the integrated circuit 1 has other input and output terminals and the logic circuit 5 may be of any type. Furthermore, the integrated circuit 1 may have several differential input stages, as well as other elements that are independent of the invention.

The first and second input pads 2 and 3 are connected externally to connection wires which convey a pair of differential signals. The differential input stage has two inputs and one output. The inputs are connected to the input pads 2 and 3 and the output is connected to the logic circuit 5. The differential input stage furthermore comprises an input circuit 6 and a shaping circuit 7.

The input circuit 6 has two inputs which are the same as the inputs of the differential stage 4 and are connected to the input pads 2 and 3, and four outputs organized in groups of first and second pairs of differential signals that are connected to the shaping circuit 7. The shaping circuit 7 furthermore has an output that is the same as the output of the differential input stage 4.

The input circuit 6 has first, second, third and fourth differential amplifiers 8 to 11, each having one non-inverting input, one inverting input and one output. The non-inverting inputs of the first and third amplifiers 8 and 10 and the inverting inputs of the second and fourth amplifiers 9 and 11 are connected to the first input pad 2. The inverting inputs of the first and third amplifiers 8 and 10 and the non-inverting inputs of the second and fourth amplifiers 9 and 11 are connected to the second input pad 3. The first and second amplifiers 8 and 9 form first means that give the first pair of differential signals and the third and fourth amplifiers 10 and 11 form second means that give the second pair of differential signals.

The first and second amplifiers 8 and 9 each work on a first range of voltages between, for example, a voltage substantially equal to the threshold voltage of a MOS transistor and a voltage greater than the supply voltage. In practice, the upper limit is equal to about one volt above the supply voltage and is fixed by the devices used to protect the integrated circuit 1. The third and fourth amplifiers 10 and 11 each work on a second range of voltages between, for example, a voltage substantially equal to the supply voltage minus a threshold voltage of a MOS transistor and a voltage lower than 0 volts. In practice, the lower limit is equal to about one volt below 0 volts and is fixed by devices used to protect the integrated circuit 1.

When the inputs of the first to fourth amplifiers 8 to 11 are outside their range of operation, the output voltage is indeterminate. To avoid dysfunctioning, if any, first and second resistive type loads 12 and 13 are placed respectively between the outputs of the first and second amplifiers 8 and 9 and between the outputs of the third and fourth amplifiers 10 and 11. The role of the loads 12 and 13 is to bring the differential voltages between the outputs of the first and second amplifiers 8 and 9 and between the outputs of the third and fourth amplifiers 10 and 11 to a zero voltage when the voltages of the amplifiers 9 to 11 are in an indeterminate state.

The shaping circuit has fifth, sixth, seventh and eighth amplifiers 14 to 17, each having an inverting input and a non-inverting input and an output. The fifth to eighth amplifiers 14 to 17 are all of one and the same type. The non-inverting input of the fifth amplifier 14 and the inverting input of the seventh amplifier 16 are connected to the output of the first amplifier 8 to receive one of the signals of the first pair of differential signals. The inverting input of the fifth amplifier 14 and the non-inverting input of the seventh amplifier 16 are connected to the output of the second amplifier 9 to receive the other signal of the first pair of differential signals. The non-inverting input of the sixth amplifier 15 and the inverting input of the eighth amplifier 17 are connected to the output of the third amplifier 10 to receive one of the signals of the second pair of differential signals. The inverting input of the sixth amplifier 15 and the non-inverting input of the eighth amplifier 17 are connected to the output of the fourth amplifier 11 to receive the other signal of the second pair of differential signals.

The fifth and sixth amplifiers 14 and 15 form means to differentiate the first and second pairs of differential signals. This is also the case for the seventh and eighth amplifiers 16 and 17 which have their inputs respectively inverted with respect to the fifth and sixth amplifiers 14 and 15 to produce complementary signals.

First and second signal addition devices 18 and 19, each having two inputs and one output, are connected to the outputs of the fifth to eighth amplifiers 14 to 17 to respectively add up the signals coming from the fifth and sixth amplifiers 14 and 15 and seventh and eighth amplifiers 16 and 17. The first addition device 18 produces a binary signal representing the output signal of the input stage and the second addition device 19 produces a complementary binary signal representing the complement of the output signal of the input stage.

The shaping circuit 7 also has a ninth amplifier 20 having two inputs, one of which is inverting, and one output. The inverting output is connected to the output of the first addition device 18 and its non-inverting input is connected to the output of the second addition device 19. The ninth amplifier 20 is used to differentiate the binary signal and the complementary binary signal. Since the output of this ninth amplifier 20 is not necessarily compatible with the logic circuit 5, a threshold inverter 21 is placed at its output. This threshold inverter 21 is for providing the output signal to the output of the input stage 4. The threshold of the threshold inverter 21 is determined to correspond substantially to the output voltage of the ninth amplifier 20 when the inputs of the amplifier 20 are at the same potential.

There are many possible variants for the input stage 4. In the present preferred example, the input circuit uses four amplifiers 8 to 11. It is clear that those skilled in the art could find equivalent devices that could be subdivided into first means to give a first pair of differential signals when the inputs receive signals in a first range of voltage, and second means to give a second pair of differential signals when the inputs receive signals in a second range of voltage without changing the object of the invention—provided that the time of propagation of the first and second means are substantially identical.

Similarly, the shaping circuit 7 must have means to differentiate each of the two pairs of differential signals and combine them to obtain a single binary type of signal. For example, it is possible to use only the fifth and sixth amplifiers 14 and 15 and the addition device 18 by connecting the output of the addition device 18 to the output of the input stage 4 by means of the threshold inverter 21 without using any ninth amplifier 20. The redundancy provided by the seventh and eighth amplifiers 16 and 17 is used to eliminate possible disparities of operation of the first and second means of the input circuit 6.

Furthermore, through the use of a logic circuit 5 implementing a differential logic, it is possible to duplicate the output of the input stage by using an additional amplifier identical to the ninth amplifier 20 whose inputs are connected in reverse with respect to the amplifier 20.

FIGS. 2 to 4 will enable those skilled in the art to construct the amplifiers used in the invention with the greatest possible efficiency. FIG. 2 shows the structure of the first and second amplifiers 8 and 9. The amplifier 8 has first and second P-channel MOS-type transistors 22 and 23 and third, fourth and fifth N-channel MOS-type transistors 24 to 26. The first and second transistors 22 and 23 form a current mirror. The second transistor 23 copies the current going through the first transistor 22. The third and fourth transistors 24 and 25 are the transistors that provide inputs to the amplifier 8. The drains of the third and fourth transistors 24 and 25 are respectively connected to the drains of the first and second transistors 22 and 23. The sources of the third and fourth transistors 24 and 25 are connected together to the drain of the fifth transistor 26 and their gates corresponding respectively to the non-inverting input and inverting input of the amplifier 8.

The fifth transistor 26 is used to bias the amplifier 8. The gate of the fifth transistor 26 is connected to the supply voltage and its source is connected to the ground. The output of the amplifier 8 corresponds to the node formed by the connection of the drains of the second and fourth transistors 23 and 25.

The amplifier 8 gives, at its output, a voltage dependent on the inputs. If a resistive load is connected to the output, the output voltage is proportional to the difference in voltage between the two inputs. If no load is placed at the output, the output will be equal either to the supply voltage or to 0 volts. The working of an amplifier 8 of this kind is well known to those skilled in the art who know that if the voltage at both inputs is below a voltage equal to approximately a threshold voltage of a MOS transistor, then the output is in a floating state. Those skilled in the art also know that if the voltage present at the two inputs exceeds the supply voltage, then the amplifier 8 still works accurately (within a limit of non-destructive voltage). The present example uses a supply voltage of 3 volts which corresponds to a first voltage range ranging from about 1 volt to about 4 volts.

FIG. 3 shows the structure of the third and fourth amplifiers 10 and 11. The amplifier 10 has sixth and seventh N-channel MOS transistors 27 and 28 and eighth, ninth and tenth P-channel MOS transistors 29 to 31. The sixth and seventh transistors 17 and 18 form a current mirror, and the seventh transistor 28 copies the current going through the sixth transistor 27. The eighth and ninth transistors 29 and 30 are the transistors that provide inputs to the amplifiers 10, their drains being respectively connected to the drains of the sixth and seventh transistors 27 and 28, their sources being connected together to the drain of the fifth transistor 31, and their gates corresponding respectively to the inverting input and the non-inverting input of the amplifier 10. The fifth transistor 31 is used to bias the amplifier 10. The gate of the fifth transistor 31 is connected to the ground and its source is connected to the supply voltage. The output of the amplifier 10 corresponds to the node formed by the connection of the drains of the seventh and eighth transistors 28 and 30.

The amplifier 10 works in a manner similar to the amplifier 8. Those skilled in the art know that if the voltage present at the two inputs is above a voltage equal to approximately the supply voltage minus a threshold voltage of a MOS transistor, the output is in a floating state. Those skilled in the art also know that if the voltage present at the two inputs is below 0 V, the amplifier 10 still works accurately (within a limit of non-destructive voltage). In the present example, the second range of voltage is from about −1 V to about 2 V.

In order that the first to fourth amplifiers 8 to 11 may have equivalent propagation times, it is enough to size the N-channel and P-channel transistors having equivalent functions between FIGS. 1 and 2 so that the temporal characteristics of the transistors are similar. Thus the first and second transistors 22 and 23 must be symmetrically related with the sixth and seventh transistors 27 and 28. The third and fourth transistors 24 and 25 must be symmetrically related with the eighth and ninth transistors 29 and 30. And he fifth transistor 26 must be symmetrically related with the tenth transistor 31. The symmetrical relation corresponds to a ratio of surface area between the transistors that takes into account the mobility of the carriers of each type of dopant. For example, with a standard CMOS method, there should be a width of a P-channel transistor equal to about 2.5 times the width of an N-channel transistor with the same length so that the transistors are equivalent.

The circuits of FIGS. 2 and 3 are equivalent. However, they have working disparities. A first disparity is due to the tolerance values with respect to doping in the manufacture of the circuits. A second disparity arises out of the connection of the outputs of the first to fourth amplifiers 8 to 11 by means of the resistive loads 12 and 13. A secondary effect of the use of complementary amplifiers is that it brings into action a common mode voltage between the outputs of the first and second amplifiers 8 and 9 and between the outputs of the third and fourth amplifiers 10 and 11. This common mode voltage is different depending on the type of amplifier. This common mode voltage depends, firstly, on the common mode voltage at the input and secondly on the constitution of the amplifiers.

These disparities of operation create a phase jitter effect in the fifth and sixth amplifiers 14 and 15. The addition of the seventh and eighth amplifiers 16 and 17 make it possible to compensate for this phenomenon. Those skilled in the art will note however that the phase jitter created by the disparities of operation of the first to fourth amplifiers 8 to 11 is substantially lower than that which existed in the prior art. Those skilled in the art could therefore very well not seek to compensate for this jitter if the result obtained were to be sufficient.

FIG. 4 shows a preferred embodiment of the fifth and sixth amplifiers 14 and 15 and of the first addition device 18. In this FIG. 4, the fifth and sixth amplifiers 14 and 15 share a common load which adds up the output signals of said fifth and sixth amplifiers 14 and 15 in setting up a wired OR logic circuit.

The circuit of FIG. 4 has eleventh and twelfth P-channel MOS transistors 32 and 33 and thirteenth to eighteenth N channel MOS transistors 34 to 39. The eleventh and twelfth transistors 32 and 33 form a current mirror, the twelfth transistor 33 copying the current that goes through the eleventh transistor 32. The thirteenth and fourteenth transistors 34 and 35 are the transistors that provide inputs to the fifth amplifier 14, their drains being respectively connected to the drains of the eleventh and twelfth transistors 32 and 33, their sources being connected together to the drain of the fifteenth transistor 36, and their gates corresponding respectively to the non-inverting input and the inverting input of the amplifier 14. The fifteenth transistor 36 is used to bias the amplifier 14, its gate is connected to the supply voltage and its source is connected to the ground. The sixteenth and seventeenth transistors 37 and 38 are transistors that provide inputs to the sixth amplifier 15, their drains being respectively connected to the drains of the eleventh and twelfth transistors 32 and 33, their sources being connected together to the drain of the eighteenth transistor 39, and their gates corresponding respectively to the non-inverting input and the inverting input of the amplifier 15. The eighteenth transistor 36 is used to bias the amplifier 15, its gate is connected to the supply voltage and its source is connected to the ground. The outputs of the fifth and sixth amplifiers 15 and 16 correspond to the node formed by the connection of the drains of the twelfth, fourteenth and seventeenth transistors 33, 35 and 38.

The circuit of FIG. 4 works in the same way as the circuit of FIG. 2. Those skilled in the art will note that the use of a single current mirror amounts to adding up the currents that should come out of the two amplifiers of the type shown in FIG. 2. Since this assembly directly drives the MOS transistor gates, the output voltage is determined by the charging of a capacitor corresponding to an equivalent capacitance at the gates of the driven transistors.

The drawing of FIG. 5 shows a variant of the input circuit 6 which has less disparity of operation. The input circuit of FIG. 5 has the first to fourth amplifiers 8 to 11, the first and second resistive loads 12 and 13, tenth to thirteenth amplifiers 40 to 43, and third and fourth resistive loads 44 and 45. The tenth and eleventh amplifiers 40 and 41 are identical to the third and fourth amplifiers 10 and 11. The twelfth and thirteenth amplifiers 42 and 43 are identical to the first and second amplifiers 8 and 9. The third and fourth resistive loads 44 and 45 are identical to the first and second resistive loads 12 and 13.

The first to fourth amplifiers 8 to 11 and the first and second resistive loads are connected as indicated here above to provide first and second pairs of intermediate differential signals. The non-inverting input of the tenth amplifier 40 and the inverting input of the eleventh amplifier 41 are connected to the output of the first amplifier 8. The inverting input of the tenth amplifier 40 and the non-inverting input of the eleventh amplifier 41 are connected to the output of the second amplifier 9. The non-inverting input of the twelfth amplifier 42 and the inverting input of the thirteenth amplifier 43 are connected to the output of the third amplifier 10. The inverting input of the twelfth amplifier 42 and the non-inverting input of the thirteenth amplifier 43 are connected to the output of the fourth amplifier 11. The tenth and eleventh amplifiers 40 and 41 form third means that give the first pair of differential signals at output of the input circuit 6, and the twelfth and thirteenth amplifiers 42 and 43 form fourth means that give the second pair of differential signals at the output of the input circuit 6. The third and fourth loads 44 and 45 are placed respectively between the outputs of the tenth and eleventh amplifiers 40 and 41 and between the outputs of the twelfth and thirteenth amplifiers 42 and 43.

The input circuit 6 of FIG. 5 provides compensation for the disparities of operation of the first to fourth amplifiers 8 to 11. The disparities due to the manufacturing tolerances are eliminated because the two pairs of differential signals each go through amplifiers of the same kind. Furthermore, the common mode voltage at output of the tenth to thirteenth amplifiers 40 to 43 depends less on the common mode voltage present at the first and second input terminals 2 and 3. Since the jitter coming from the disparities of operation is greatly diminished, it is possible to eliminate the seventh to ninth amplifiers 16, 17 and 20 of the shaping circuit 7. However, in the present example which uses resistive loads at the output of the amplifiers of the input circuit 6, the circuit of FIG. 5 has slightly elevated propagation times and a substantial space requirement. The circuit of FIG. 5 may, however, be very valuable in certain applications.

This circuit of FIG. 5 may be transposed to input circuits 6 that do not use amplifiers, but instead use first and second means that provide first and second pairs of intermediate differential signals. The first and second means respectively operate in first and second voltage zones and have substantially identical propagation times. The compensation for the first and second means is done by the addition of third means, identical to the second means, whose inputs are connected to the outputs of the first means to provide the first pair of differential signals. The compensation is also done by the addition of fourth means, identical to the first means, whose inputs are connected to the outputs of the second means to provide the second pair of differential signals.

That which is claimed is:

1. An integrated circuit comprising:
at least one differential input stage having two differential inputs and one output, the at least one differential input stage comprising an input circuit and a shaping circuit connected to the input circuit for providing a binary output signal at an output terminal;
said input circuit having two inputs connected to the two inputs of the differential input stage and comprising
first means coupled to said two inputs to provide a first pair of differential signals when the two inputs receive signals in a first range of voltage, and a zero differential voltage when the two inputs receive said signals outside the first range of voltage, and
second means coupled to said two inputs to provide a second pair of differential signals when the two inputs receive said signals in a second range of voltage, and a zero differential voltage when the two inputs receive said signals outside the second range of voltage,
said first means and said second means having substantially identical signal propagation times.

2. An integrated circuit according to claim 1, wherein the shaping circuit comprises means for differentiating each of the two pairs of differential signals and combining the two pairs of differential signals to obtain said single binary output signal.

3. An integrated circuit according to claim 1, wherein said first means comprises first and second amplifiers, each having an inverting input, a non-inverting input and an output; wherein the non-inverting input of the first amplifier and the inverting input of the second amplifier are connected to the first of the two inputs; wherein the inverting input of the first amplifier and the non-inverting input of the second amplifier are connected to a second of the two inputs.

4. An integrated circuit according to claim 3, wherein said second means comprise third and fourth amplifiers, each having an inverting input, a non-inverting input and an output; wherein the non-inverting input of the third amplifier and the inverting input of the fourth amplifier are connected to the first of the two inputs; wherein the inverting input of the third amplifier and the non-inverting input of the fourth amplifier are connected to the second of the two inputs.

5. An integrated circuit according to claim 4, wherein each of the first and second amplifiers comprises input transistors of a first type and each of the third and fourth amplifiers comprises input transistors of a second type; and wherein the input transistors of the amplifiers have the same size to have the substantially identical signal propagation times.

6. An integrated circuit according to claim 4, further comprising:
a first resistive load connected between the outputs of the first and second amplifiers; and
a second resistive load connected between the outputs of the third and fourth amplifiers.

7. An integrated circuit according to claim 2, wherein the shaping circuit comprises fifth and sixth amplifiers, each having an inverting input and a non-inverting input and an output; wherein the non-inverting input of the fifth amplifier receives one of the first pair of differential signals; wherein the inverting input of the fifth amplifier receives the other of the first pair of differential signals; wherein the non-inverting input of the sixth amplifier receives one of the second pair of differential signals; wherein the inverting input of the sixth amplifier receives the other of the second pair of differential signals; and wherein the outputs of the fifth and sixth amplifiers are combined to provide a combined signal.

8. An integrated circuit according to claim 7, wherein the shaping circuit further comprises seventh and eighth amplifiers identical to the fifth and sixth amplifiers; wherein the inputs of the seventh amplifier are inverted with respect to the fifth amplifier and the inputs of the eighth amplifier are inverted with respect to the sixth amplifier; wherein the outputs of the seventh and eighth amplifiers are combined in a same way as for the fifth and sixth amplifiers to provide a complementary binary signal representing a complement of the combined signal.

9. An integrated circuit according to claim 8, wherein the shaping circuit further comprises a ninth amplifier having two inputs, one of which is an inverting input, and one output; wherein one of the inputs receives the combined signal and the other receives the complementary binary signal.

10. An integrated circuit according to claim 9, further comprising an inverter connected to the output of the ninth amplifier to provide said binary output signal; and wherein the inverter has a threshold adapted to the ninth amplifier.

11. An integrated circuit according to claim 4, wherein the input circuit further comprises:

third means identical to the second means and having inputs connected to the outputs of the first means to provide the first pair of differential signals; and fourth means identical to the first means and having inputs connected to the outputs of the second means to provide the second pair of differential signals.

12. An integrated circuit differential input stage comprising:

an input circuit comprising first means coupled to two inputs to provide a first pair of differential signals when the two inputs receive signals in a first range of voltage, and a zero differential voltage when the two inputs receive said signals outside the first range of voltage, and second means coupled to said two inputs to provide a second pair of differential signals when the two inputs receive said signals in a second range of voltage, and a zero differential voltage when the two inputs receive said signals outside the second range of voltage, said first means and said second means having substantially identical signal propagation times; and a shaping circuit connected to receive the first pair and second pair of said differential signals of the input circuit for providing a binary output signal.

13. An integrated circuit differential input stage according to claim 12, wherein the shaping circuit comprises means for differentiating each of the two pairs of differential signals and combining the two pairs of differential signals to obtain said single binary output signal.

14. An integrated circuit differential input stage according to claim 12, wherein said first means comprises first and second amplifiers, each having an inverting input, a non-inverting input and an output; wherein the non-inverting input of the first amplifier and the inverting input of the second amplifier are connected to a first of the two inputs; wherein the inverting input of the first amplifier and the non-inverting input of the second amplifier are connected to a second of the two inputs.

15. An integrated circuit differential input stage according to claim 14, wherein said second means comprise third and fourth amplifiers, each having an inverting input, a non-inverting input and an output; wherein the non-inverting input of the third amplifier and the inverting input of the fourth amplifier are connected to the first of the two inputs; wherein the inverting input of the third amplifier and the non-inverting input of the fourth amplifier are connected to the second of the two inputs.

16. An integrated circuit differential input stage according to claim 15, wherein each of the first and second amplifiers comprises input transistors of a first type and each of the third and fourth amplifiers comprises input transistors of a second type; and wherein the input transistors of the amplifiers have the same size to have the substantially identical signal propagation times.

17. An integrated circuit differential input stage according to claim 15, further comprising:

a first resistive load connected between the outputs of the first and second amplifiers; and a second resistive load connected between the outputs of the third and fourth amplifiers.

18. An integrated circuit differential input stage according to claim 13, wherein the shaping circuit comprises fifth and sixth amplifiers, each having an inverting input and a non-inverting input and an output; wherein the non-inverting input of the fifth amplifier receives one of the first pair of differential signals; wherein the inverting input of the fifth amplifier receives the other of the first pair of differential signals; wherein the non-inverting input of the sixth amplifier receives one of the second pair of differential signals; wherein the inverting input of the sixth amplifier receives the other of the second pair of differential signals; and wherein the outputs of the fifth and sixth amplifiers are combined to provide a combined signal.

19. An integrated circuit according to claim 18, wherein the shaping circuit further comprises seventh and eighth amplifiers identical to the fifth and sixth amplifiers; wherein the inputs of the seventh amplifier are inverted with respect to the fifth amplifier and the inputs of the eighth amplifier are inverted with respect to the sixth amplifier; wherein the outputs of the seventh and eighth amplifiers are combined in a same way as for the fifth and sixth amplifiers to provide a complementary binary signal representing a complement of the combined signal.

20. An integrated circuit differential input stage according to claim 19, wherein the shaping circuit further comprises a ninth amplifier having two inputs, one of which is an inverting input, and one output; wherein one of the inputs receives the combined signal and the other receives the complementary binary signal.

21. An integrated circuit differential input stage according to claim 20, further comprising an inverter connected to the output of the ninth amplifier to provide said binary output signal; and wherein the inverter has a threshold adapted to the ninth amplifier.

22. An integrated circuit differential input stage according to claim 15, wherein the input circuit further comprises:

third means identical to the second means and having inputs connected to the outputs of the first means to provide the first pair of differential signals; and fourth means identical to the first means and having inputs connected to the outputs of the second means to provide the second pair of differential signals.

23. An integrated circuit comprising: an input circuit comprising a first circuit coupled to two inputs to provide a first pair of differential signals when the two inputs receive signals in a first range of voltage, and a substantially zero differential voltage when the two inputs receive said signals outside the first range of voltage, and a second circuit coupled to said two inputs to provide a second pair of differential signals when the two inputs receive said signals in a second range of voltage, and a substantially zero differential voltage when the two inputs receive said signals outside the second range of voltage, said first and second circuits having substantially identical signal propagation times; and a shaping circuit connected to receive the first pair and second pair of said differential signals of the input circuit for providing a binary output signal.

24. An integrated circuit according to claim 23, wherein the shaping circuit comprises means for differentiating each of the two pairs of differential signals and combining the two pairs of differential signals to obtain said binary output signal.

25. An integrated circuit according to claim 23, wherein said first circuit comprises first and second amplifiers, each having an inverting input, a non-inverting input and an output; wherein the non-inverting input of the first amplifier and the inverting input of the second amplifier are connected to a first of the two inputs; wherein the inverting input of the first amplifier and the non-inverting input of the second amplifier are connected to a second of the two inputs.

26. An integrated circuit according to claim 25, wherein said second circuit comprise third and fourth amplifiers, each having an inverting input, a non-inverting input and an output; wherein the non-inverting input of the third amplifier and the inverting input of the fourth amplifier are connected to the first of the two inputs; wherein the inverting input of the third amplifier and the non-inverting input of the fourth amplifier are connected to the second of the two inputs.

27. An integrated circuit according to claim 26, wherein each of the first and second amplifiers comprises input transistors of a first type and each of the third and fourth amplifiers comprises input transistors of a second type; and wherein the input transistors of the amplifiers have the same size to have the substantially identical signal propagation times.

28. An integrated circuit according to claim 26, further comprising:

a first resistive load connected between the outputs of the first and second amplifiers; and a second resistive load connected between the outputs of the third and fourth amplifiers.

29. An integrated circuit according to claim 24, wherein the shaping circuit comprises fifth and sixth amplifiers, each having an inverting input and a non-inverting input and an output; wherein the non-inverting input of the fifth amplifier receives one of the first pair of differential signals; wherein the inverting input of the fifth amplifier receives the other of the first pair of differential signals; wherein the non-inverting input of the sixth amplifier receives one of the second pair of differential signals; wherein the inverting input of the sixth amplifier receives the other of the second pair of differential signals; and wherein the outputs of the fifth and sixth amplifiers are combined to provide a combined signal.

* * * * *